United States Patent [19]
Ruitenburg

[11] Patent Number: 5,640,688
[45] Date of Patent: Jun. 17, 1997

[54] TUNER AND SPLITTER-MODULATOR CIRCUIT HAVING A COMMON QUARTZ CRYSTAL

[75] Inventor: Leo Ruitenburg, Swalmen, Netherlands

[73] Assignee: U.S. Philips Corporation, New York, N.Y.

[21] Appl. No.: 426,294

[22] Filed: Apr. 20, 1995

[30] Foreign Application Priority Data

Apr. 21, 1994 [DE] Germany ............... 44 13 927.6

[51] Int. Cl.$^6$ ............................................. H04B 1/40
[52] U.S. Cl. ................... 455/84; 455/76; 455/77; 386/46
[58] Field of Search ................. 455/77, 84, 85, 455/86, 105, 112, 118, 120, 125, 76, 193.1, 197.3; 386/46; 348/726, 727, 731

[56] References Cited

U.S. PATENT DOCUMENTS

| | | |
|---|---|---|
| 4,231,116 | 10/1980 | Sekiguchi et al. ............. 455/118 |
| 4,349,919 | 9/1982 | Richardson ..................... 455/86 |
| 4,521,916 | 6/1985 | Wine . |
| 4,660,182 | 4/1987 | Bates et al. ..................... 455/112 |
| 4,692,803 | 9/1987 | Tobita . |
| 4,969,050 | 11/1990 | Maier Te Al. . |
| 5,138,456 | 8/1992 | Frixon . |
| 5,519,885 | 5/1996 | Vaisanen ........................ 455/86 |

OTHER PUBLICATIONS

"New High Density Multistandard RF–Concept for VCR" G.M. Maier et al, Thomson Consumer Electronics R&D Labs, Germany/Singapore; IEEE Transactions on Consumer Electronics, Bd. 38, Nr. 3, 1. Aug. 1992, Seiten 389–392, XP000311869.

Excerpt from European Search Report dated Aug. 20, 1996.

Primary Examiner—Reinhard J. Eisenzopf
Assistant Examiner—Gertrude Arthur
Attorney, Agent, or Firm—Bernard Franzblau

[57] ABSTRACT

A circuit arrangement comprising a tuner and a splitter-modulator, the latter made up of a splitter and a modulator, the splitter having an RF signal input for receiving an RF input signal, an RF signal output for supplying an RF output signal, and a first line for applying the RF input signal to the tuner. A second line is provided for supplying an RF output signal from the modulator. The tuner is adapted to demodulate the RF input signal and the modulator is adapted to, convert a baseband signal into the RF output signal to be supplied by the modulator. Devices for generating reference oscillations for the tuner and the splitter-modulator have one quartz crystal which is common to the tuner and the splitter-modulator. This results in a reduction in the number of components, particularly for generating the oscillations.

8 Claims, 2 Drawing Sheets

ID A COMMON QUARTZ
TUNER AND SPLITTER-MODULATOR CIRCUIT HAVING A COMMON QUARTZ CRYSTAL

BACKGROUND OF THE INVENTION

This invention relates to a circuit arrangement comprising a tuner and a splitter-modulator comprising a splitter and a modulator.

Conventional tuners and splitter-modulators each require a crystal oscillator as a frequency reference. A circuit arrangement which comprises both a tuner and a splitter-modulator, as is preferably the case in RF processing stages in video recorders, should thus comprise two quartz crystals, which requires a large number of components.

SUMMARY OF THE INVENTION

It is an object of the invention to reduce the number of components for a circuit arrangement which comprises both a tuner and a splitter-modulator.

According to the invention, this object is solved by a circuit arrangement comprising a tuner and a splitter-modulator comprising a splitter and a modulator, in which the splitter has an RF signal input for applying an RF input signal, an RF signal output for supplying an RF output signal, a first line for applying the RF input signal to the tuner and a second line for supplying an RF output signal from the modulator, the tuner being adapted to demodulate the RF input signal and the modulator being adapted to convert a baseband signal into the RF output signal to be supplied by said modulator, and comprising means for generating reference oscillations for the tuner and the splitter-modulator, said generating means having one quartz crystal which is common to at least the tuner and the splitter-modulator.

To reduce the number of components, the invention derives the frequency reference for the tuner and the splitter-modulator from a single quartz crystal or crystal oscillator. Compared to the prior art, one crystal oscillator can then be dispensed with. The sole crystal oscillator can then feed a synthesizer in the tuner and a synthesizer in the splitter-modulator. Particularly, the quartz crystal or crystal oscillator of the tuner is also utilized by the splitter-modulator. Instead of the separate crystal oscillator, a transistor coupling stage may preferably be inserted in the splitter-modulator between the quartz crystal of the tuner and the synthesizer of the splitter-modulator. The synthesizer may comprise a phase-locked loop. The reference oscillations as well as their low-ohmic coupling into the synthesizer of the splitter-modulator can be amplified by this transistor coupling stage.

In an advantageous embodiment of the invention, the devices for generating reference oscillations comprise a phase-locked loop which is common to the tuner and the splitter-modulator. In this embodiment, the number of components is further reduced in that only a single, common synthesizer is used for the tuner and splitter-modulator which are combined into one group. For this purpose, only one quartz crystal, only one phase-locked loop and only one oscillator stage are required.

BRIEF DESCRIPTION OF THE DRAWINGS

These and other aspects of the invention will be apparent from and elucidated with reference to the embodiments described hereinafter.

In the drawings.

DESCRIPTION OF THE PREFERRED EMBODIMENTS

Figure 1:
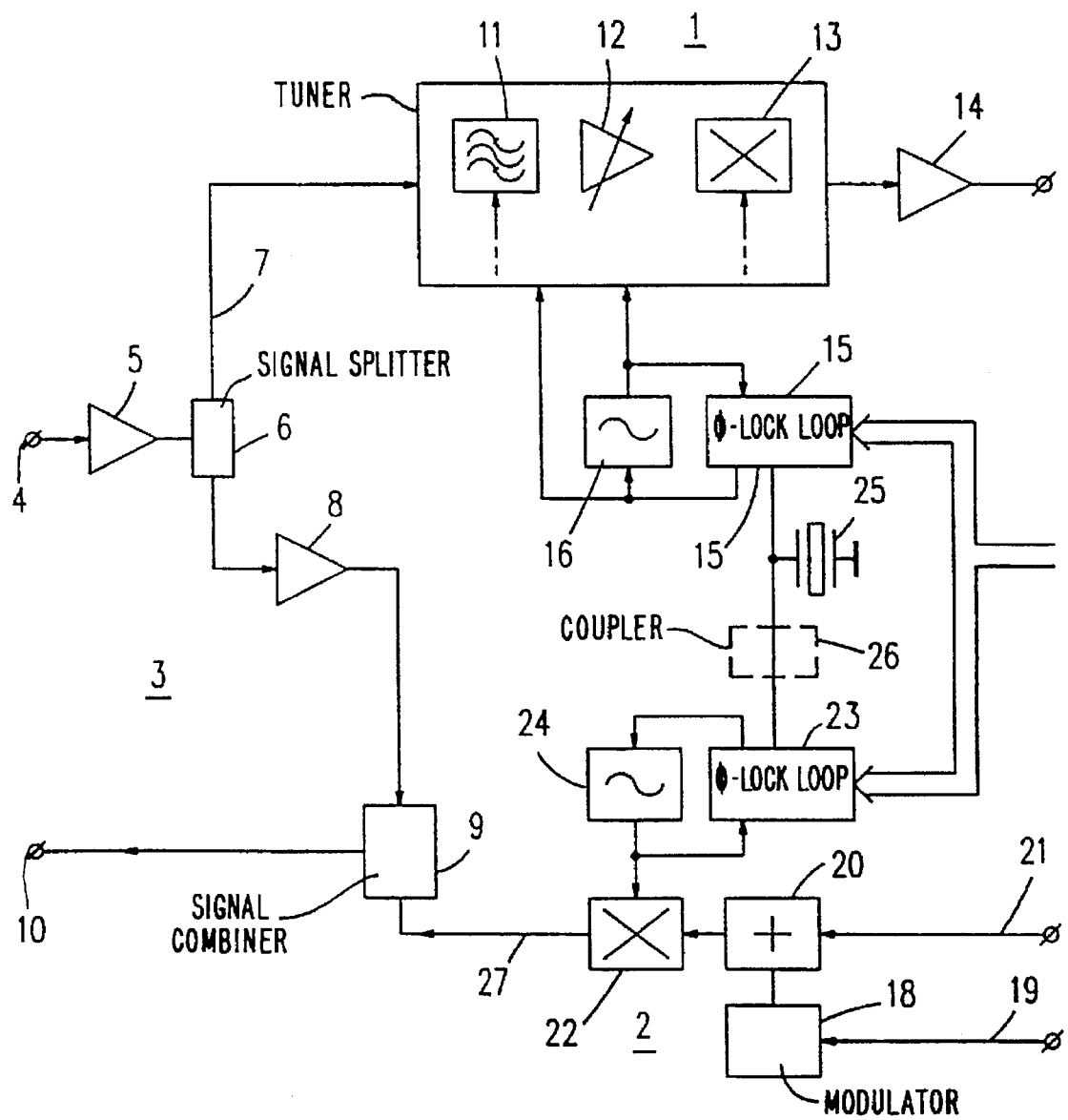
FIG. 1 shows a first embodiment of a combination of a tuner and a splitter-modulator with a common quartz crystal.

Corresponding elements are denoted by the same reference numerals.

FIG. 1 shows a combination of a tuner 1, a modulator 2 and a splitter 3, in which the modulator 2 and splitter 3 are combined to form a splitter-modulator. An RF input signal, for example, a television signal can be applied from an antenna to the splitter 3 via an RF signal input 4. This signal is applied via a first preamplifier 5 to a first signal splitter 6 and from this splitter to a first line 7, and to a second signal splitter 9 via a second preamplifier 8. The signal can be supplied from this splitter via an RF signal output 10.

The RF input signal is applied through the first line 7 to the tuner 1 in which a frequency selection 11, an amplitude control 12 and a down-conversion 13 are customarily performed by stages which are conventionally used for this purpose. An IF signal is supplied via an output amplifier 14. Reference oscillations from a synthesizer associated with the tuner 1 and comprising a phase-locked loop 15 and an oscillator stage 16 are applied in conventional manner to frequency selection stage 11 and down-conversion stage 13. The phase-locked loop 15 is controllable via control lines 17, preferably an I2C bus, for the purpose of tuning the tuner 1.

The modulator 2 comprises a known audio signal modulator 18, an audio signal input 19 of which can receive an audio baseband signal which is modulated on a sound carrier oscillation. The modulated audio signal is superimposed in a superposition stage 20 on a video baseband signal supplied via a video signal input 21. The combined baseband signal thus obtained is modulated on an RF carrier oscillation in a baseband signal modulator stage 22, which oscillation is generated in a synthesizer of the modulator 2, which synthesizer comprises a second phase-locked loop 23 and a second oscillator stage 24. In principle, the synthesizer 23, 24 of the modulator 2 has the same structure as that of the tuner 1. Particularly, both synthesizers 15, 16 and 23, 24 are controlled by a single quartz crystal, while a transistor coupling stage 26 for amplifying the oscillation and low-ohmic coupling may be arranged between the quartz crystal 25 and the second phase-locked loop 23.

A second line 27 supplies the RF output signal of the modulator 2 from the baseband signal modulator stage 22 to the second signal splitter 9 of the splitter 3, via which it reaches the RF signal output 10.

Figure 2:
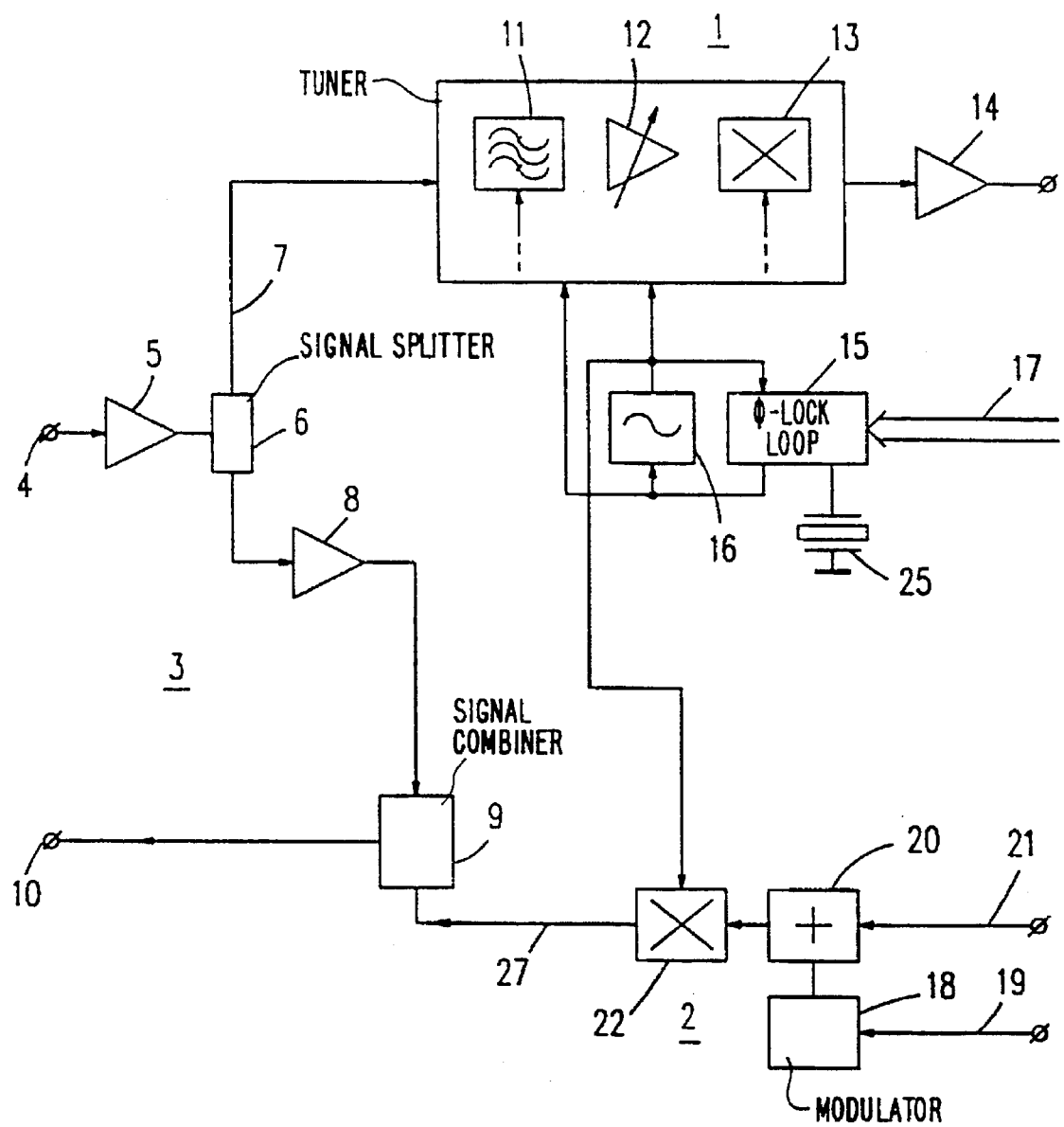
FIG. 2 shows such a combination with a common quartz crystal and a common synthesizer.

In the embodiment of FIG. 2, which is otherwise identical to that shown in FIG. 1, the second phase-locked loop 23 and the second oscillator stage 24, i.e. the separate synthesizer of the modulator 2, have been omitted. The baseband signal modulator stage 22 of the modulator 2 is directly fed from the oscillator stage 16 of the synthesizer of the tuner 1.

These circuit arrangements are preferably used in RF processing stages of video recorders.

I claim:

1. A circuit arrangement for an RF processing stage of a video recorder comprising: a tuner and a splitter-modulator where the splitter-modulator comprises a splitter and a modulator, the splitter having an RF signal input for receiving an RF input signal, an RF signal output for supplying an RF output signal, a first line for applying the RF input signal to the tuner and a second line for supplying an RF output signal from the modulator, the tuner being adapted to demodulate the RF input signal and the modulator being adapted to convert a baseband signal into the RF output signal to be supplied by said modulator, and means for generating reference oscillations for the tuner and the splitter-modulator, said generating means having only one quartz crystal which is common to the tuner and the splitter-modulator.

2. A circuit arrangement as claimed in claim 1, wherein means for generating reference oscillations comprise a single phase-locked loop which is common to the tuner and the splitter-modulator.

3. In a video recorder, an RF signal processing apparatus comprising:

an input terminal for receiving an RF input signal, a signal splitter having an input coupled to said input terminal and an output for supplying the RF output signal, a tuner circuit having an input coupled to the output of the signal splitter, means for demodulating the RF signal, and an output coupled to an I.F. output terminal, a modulator which converts a baseband signal into an RF output signal, means coupled to the tuner and to the modulator for generating reference frequency oscillations for the tuner and modulator and which includes a single quartz crystal which is common to the tuner and to the modulator, and means for coupling an output of the modulator to an RF output terminal.

4. The RF signal processing apparatus as claimed in claim 3 wherein said reference frequency generating means comprises:

a first synthesizer circuit coupled to said quartz crystal, a second synthesizer circuit coupled to said quartz crystal, wherein said second synthesizer circuit includes an oscillator having an output coupled to the modulator but not to the first synthesizer circuit, and wherein the first synthesizer circuit includes an oscillator having an output coupled to the tuner but not to the second synthesizer circuit.

5. The RF signal processing apparatus as claimed in claim 4 wherein said first and second synthesizer circuits further comprise first and second respective phase-locked loops.

6. The RF signal processing apparatus as claimed in claim 3 wherein the tuner includes a mixer which receives said reference frequency oscillations, and wherein the frequencies of signals in the modulator and the tuner mixer have no fixed relationship to one another.

7. The RF signal processing apparatus as claimed in claim 3 wherein said coupling means comprises a signal combining circuit having first and second inputs coupled to a second output of the signal splitter and to the output of the modulator, respectively, and an output coupled to said RF output terminal.

8. The RF signal processing apparatus as claimed in claim 3 wherein said reference frequency generating means comprises a single phase-locked loop which is coupled to the tuner circuit and to the modulator.

* * * * *